US011935815B2

United States Patent
Sakai et al.

(10) Patent No.: US 11,935,815 B2
(45) Date of Patent: Mar. 19, 2024

(54) HEAT SINK AND HEAT EXCHANGER

(71) Applicant: UACJ Corporation, Tokyo (JP)

(72) Inventors: Yoshiharu Sakai, Aichi (JP); Tetsuro Hata, Aichi (JP); Gaku Torikai, Aichi (JP)

(73) Assignee: UACJ CORPORATION, Tokyo (JP)

(*) Notice: Subject to any disclaimer, the term of this patent is extended or adjusted under 35 U.S.C. 154(b) by 453 days.

(21) Appl. No.: 17/427,275

(22) PCT Filed: Feb. 6, 2020

(86) PCT No.: PCT/JP2020/004585
§ 371 (c)(1),
(2) Date: Jul. 30, 2021

(87) PCT Pub. No.: WO2020/162549
PCT Pub. Date: Aug. 13, 2020

(65) Prior Publication Data
US 2021/0358834 A1 Nov. 18, 2021

(30) Foreign Application Priority Data

Feb. 8, 2019 (JP) ................................. 2019-021316

(51) Int. Cl.
*H01L 21/00* (2006.01)
*H01L 23/473* (2006.01)
(52) U.S. Cl.
CPC .................................. *H01L 23/473* (2013.01)
(58) Field of Classification Search
CPC .................................................... H01L 23/475
See application file for complete search history.

(56) References Cited

U.S. PATENT DOCUMENTS 9,643,283 B2 * 5/2017 Itoh ......................... B23K 35/38
2017/0215302 A1 * 7/2017 Totani ................. H05K 7/20509
2023/0003456 A1 * 1/2023 Katahira ................. F28D 7/106

FOREIGN PATENT DOCUMENTS

JP 2007012719 A 1/2007
JP 2010114174 A 5/2010
(Continued)

OTHER PUBLICATIONS

English translation of the International Search Report dated Apr. 21, 2020 for parent application No. PCT/JP2020/004585.
(Continued)

*Primary Examiner* — Richard A Booth
(74) *Attorney, Agent, or Firm* — J-TEK LAW PLLC; Jeffrey D. Tekanic; Scott T. Wakeman

(57) ABSTRACT

A coolant passageway (2) of a heat sink (1) has a coolant lead-in part (21), a coolant lead-out part (22), coolant-contact parts (23), coolant-transit parts (25), and connecting parts (24). The coolant-contact parts (23) are disposed spaced apart from one another along a coolant path leading from the coolant lead-in part (21) to the coolant lead-out part (22) and are configured such that they bring the coolant into contact with a cooling-wall part. The coolant-transit parts (25) are disposed between adjacent coolant-contact parts (23) and are configured such that the coolant can transit from upstream-side coolant-contact parts (23) to downstream-side coolant-contact parts (23) in the coolant paths. The connecting parts (24) are interposed between the coolant-transit parts (25) and the coolant-contact parts (23) and have a passageway cross-sectional area that is smaller than those of the coolant-contact parts (23) and the coolant-transit parts (25).

18 Claims, 10 Drawing Sheets

(56) References Cited

FOREIGN PATENT DOCUMENTS

JP 2012013249 A 1/2012
JP 2014033063 A 2/2014

OTHER PUBLICATIONS

English translation of the Written Opinion of the International Searching Authority for parent application No. PCT/JP2020/004585.

* cited by examiner

COMPARATIVE EXAMPLE

COMPARATIVE EXAMPLE

COMPARATIVE EXAMPLE

HEAT SINK AND HEAT EXCHANGER

CROSS-REFERENCE

This application is the US national stage of International Patent Application No. PCT/JP2020/004585 filed on Feb. 6, 2020, which claims priority to Japanese Patent Application No. 2019-021316 filed on Feb. 8, 2019.

TECHNICAL FIELD

The present invention relates to a heat sink and a heat exchanger.

BACKGROUND ART

A heat exchanger, which comprises a cooling-wall part on which a heat-generating body is placed, is used to cool the heat-generating body, such as a semiconductor device. For the purpose of more efficiently cooling the heat-generating body, for example, fins, such as plate fins, pin fins, or corrugated fins, are mounted on this type of cooling-wall part.

For example, in Patent Document 1 a core of a stacked heat sink is described, which is configured such that metal plates, each having numerous slits, are stacked and such that cooling water flows through those slits. The metal plates that constitute the core each have: numerous longitudinal ribs, which are long and thin and are parallel to one another; and transverse ribs each of which couple adjacent longitudinal ribs. In addition, with regard to the plurality of metal plates, the longitudinal ribs are aligned with one another and the positions of the transverse ribs are stacked offset from one another.

PRIOR ART LITERATURE

Patent Documents

Patent Document 1
Japanese Laid-open Patent Publication 2014-33063

SUMMARY OF THE INVENTION

When the coolant is flowed through the heat sink, owing to heat exchange with the heat sink, the temperature of the coolant that flows through a portion of the heat sink that is close to the inner surface becomes higher than the temperature of the coolant that flows through a portion of the heat sink that is spaced apart from the inner surface. Because the slits in the core of Patent Document 1 each exhibit an oblong shape that is extended along the flow direction of the cooling water, bias in the temperature distribution of the above-described cooling water inside the slits tends to occur. When such a bias (i.e. a steep change) in the temperature distribution of the cooling water occurs, the temperature difference between the core and the cooling water that contacts the core becomes small, and consequently there is a risk that it will lead to a decrease in heat-exchanging efficiency and, in turn, to a decrease in cooling performance.

It is one non-limiting object of the present teachings to disclose a heat sink that can improve the cooling performance of a heat exchanger, and a heat exchanger that comprises the heat sink.

In one aspect of the present teachings, a heat sink is configured such that it is mountable on a cooling-wall part, which cools a heat-generating body, in a heat exchanger and that has a coolant passageway configured such that coolant is flowable therethrough, wherein:

the coolant passageway comprises:
a coolant lead-in part, through which the coolant is introduced;
a coolant lead-out part, from which the coolant is led out;
a plurality of coolant-contact parts, which are disposed spaced apart from one another along a coolant path leading from the coolant lead-in part to the coolant lead-out part and which bring the coolant into contact with the cooling-wall part;
a coolant-transit part, which is disposed between adjacent coolant-contact parts and through which the coolant transits from an upstream-side coolant-contact part to a downstream-side coolant-contact part in the coolant path; and
connecting parts, which are interposed between the coolant-transit part and the coolant-contact parts and whose passageway cross-sectional area is smaller than those of the coolant-contact parts and the coolant-transit part.

The heat sink has the coolant passageway, which comprises: the plurality of coolant-contact parts disposed between the coolant lead-in part and the coolant lead-out part; the coolant-transit part, through which the coolant transits from the upstream-side coolant-contact part to the downstream-side coolant-contact part in the coolant path; and the connecting parts interposed between the coolant-transit part and the coolant-contact parts. In addition, the connecting parts have a passageway cross-sectional area that is smaller than those of the coolant-contact parts and the coolant-transit part.

In the coolant passageway, when the coolant flows from the coolant-transit part into the coolant-contact part, the coolant passes through the connecting part, whose passageway cross-sectional area is smaller than those of the coolant-transit part and the coolant-contact part. The coolant passageway can agitate with good efficiency the coolant that has flowed into the coolant-contact part owing to the increase/decrease of the size of the passageway. In addition, owing to the increase/decrease of the size of the passageway, the coolant passageway can agitate with good efficiency the coolant that has flowed from the coolant-contact part into the coolant-transit part as well, the same as the coolant that flows into the coolant-contact part.

Thus, because the coolant passageway is configured to repetitively increase/decrease in size along the coolant path, the coolant that flows within the coolant passageway can be agitated with good efficiency, and bias in the temperature of the coolant can be reduced. As a result, the temperature difference between the heat sink and the coolant that contacts the heat sink can be further increased, and thereby cooling performance can be further improved.

Therefore, according to the above-mentioned heat sink, the cooling performance of a heat exchanger can be improved.

DETAILED DESCRIPTION

Figure 1:
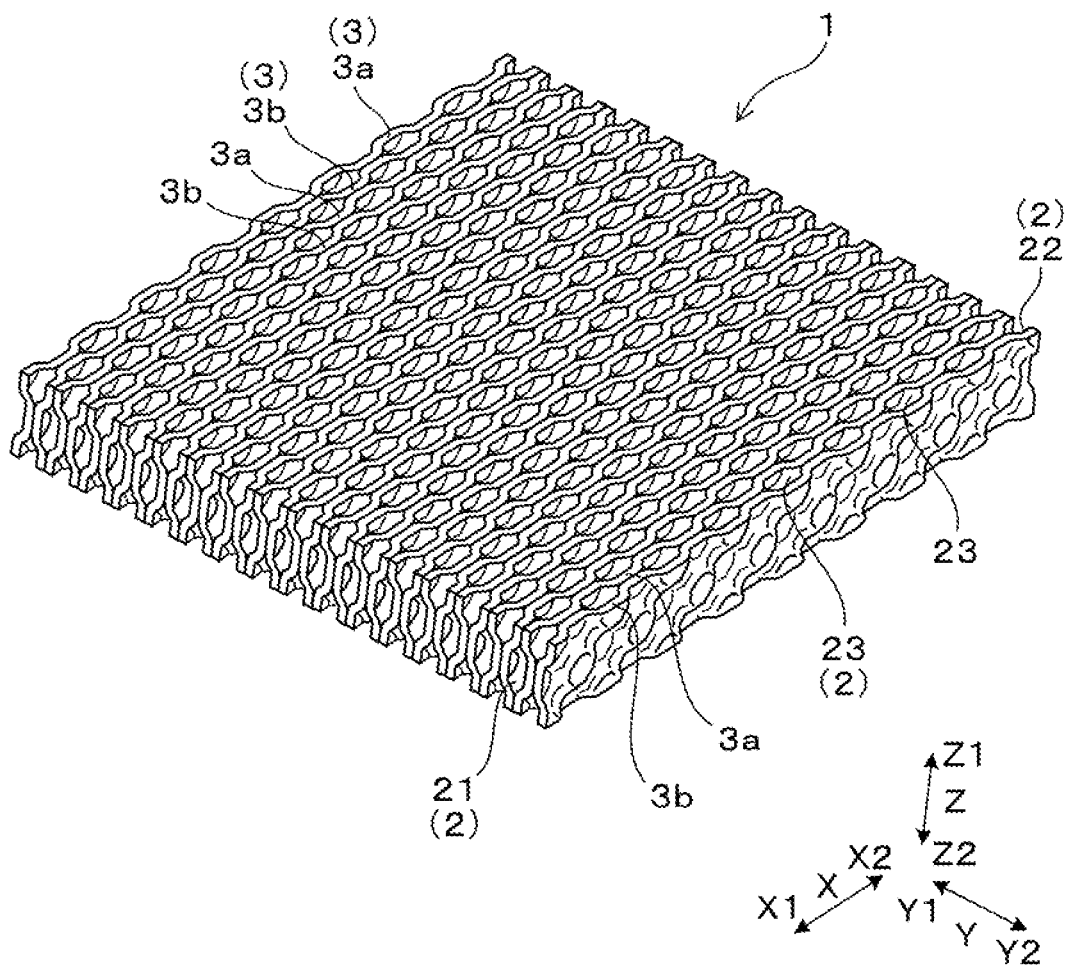
FIG. 1 is an oblique view of a heat sink according to a first embodiment.

The above-mentioned heat sink may have one coolant passageway or may have a plurality of coolant passageways. In the case of the latter, the coolant lead-in part and the coolant lead-out part of each coolant passageway may be provided such that they are separated from the coolant lead-in part(s) and the coolant lead-out part(s) of other coolant passageway(s). In addition, the plurality of coolant passageways may have a common coolant lead-in part and a common coolant lead-out part, and the plurality of coolant passageways may be connected in parallel between the coolant lead-in part and the coolant lead-out part.

The coolant-contact parts may be disposed such that they contact the cooling-wall part or may be disposed such that they are spaced apart from the cooling-wall part. From the viewpoint of further improving cooling performance, the coolant-contact parts are preferably disposed such that they contact the cooling-wall part.

The coolant-transit part is disposed, along the coolant path within the coolant passageway, between adjacent coolant-contact parts. The coolant-transit part is preferably disposed such that it is spaced farther apart from the cooling-wall part than the coolant-contact parts. In this situation, the number of the coolant-contact parts disposed in each of the coolant passageways can be further increased by further narrowing the spacing between adjacent coolant-contact parts.

In addition, by disposing the coolant-transit part at a location farther spaced apart from the cooling-wall part than the coolant-contact parts, the coolant can be agitated more efficiently in the coolant-transit part and the coolant-contact parts. There is a tendency for the temperature of the heat sink to become lower the greater the distance from the cooling-wall part becomes. Consequently, the temperature of the coolant that, inside the coolant-contact parts, has passed through a portion that is comparatively close to the cooling-wall part tends to become comparatively high owing to the exchange of heat with the cooling-wall part and the like. On the other hand, the temperature of the coolant that, inside the coolant-contact parts, has passed through a portion that is comparatively far from the cooling-wall part tends to become low compared with the temperature of the coolant that has passed through the portion that is comparatively close to the cooling-wall part. Accordingly, bias occurs in the temperature distribution of the coolant that flows out of the coolant-contact parts.

Thus, even in the situation in which there is bias in the temperature distribution of the coolant that flows out of the coolant-contact parts, by disposing the coolant-transit part at a location that is spaced farther apart from the cooling-wall part than the coolant-contact parts, the coolant can be more efficiently agitated, and thereby bias in the temperature distribution can be decreased. As a result, the temperature of the coolant that is supplied to the downstream-side coolant-contact part can be made lower than the comparatively high-temperature coolant described above.

As a result, by disposing the coolant-transit part at a location that is spaced farther apart from the cooling-wall part than the coolant-contact parts, the cooling performance of a heat exchanger can be further improved.

The coolant-contact parts and the coolant-transit part are connected via connecting parts. The connecting parts have a passageway cross-sectional area that is smaller than those of the coolant-contact parts and the coolant-transit part. That is, the coolant passageway has a portion at which the passageway cross-sectional area along the coolant path leading from the coolant-contact part to the coolant-transit part is smallest, and this portion at which the passageway cross-sectional area is smallest is referred to as a connecting part. It is noted that the passageway cross-sectional area described above refers to the cross-sectional area of a cross section that is orthogonal to the flow of the coolant inside the coolant passageway.

The connecting parts are preferably disposed such that the coolant-contact parts and the coolant-transit part are connected via the shortest distance. In this situation, an increase in pressure loss that accompanies the reduction of the passageway cross-sectional area can be further curtailed while ensuring the cooling-performance improvement effect owing to the connecting parts.

The coolant passageway may have: a second coolant-transit part, which is disposed between adjacent coolant-transit parts and through which the coolant transits from an upstream-side coolant-transit part to a downstream-side coolant-transit part in the coolant path; and a second connecting part, which is interposed between the second coolant-transit part and the coolant-transit part and whose passageway cross-sectional area is smaller than those of the coolant-transit part and the second coolant-transit part. In this situation, the coolant can be agitated in the second coolant-transit part, the same as in the coolant-transit parts.

In addition, as described above, because there is a tendency for the temperature of the heat sink to become lower the greater the distance from the cooling-wall part becomes, the temperature of the coolant that passes through the second coolant-transit part tends to become lower than the temperature of the coolant that passes through the coolant-contact part. For this reason, by providing the second coolant-transit part, the comparatively high-temperature coolant that flows in from the coolant-contact parts via the connecting parts at the coolant-transit part is caused to merge with the comparatively low-temperature coolant that flows in from the second coolant-transit part via the second connecting part, and thereby these coolants mix more efficiently and the temperature of the coolant can be further lowered. As a result, the cooling performance of the heat exchanger can be further improved.

It is noted that the second connecting part is a portion at which the passageway cross-sectional area, along the coolant path leading from the coolant-transit part to the second coolant-transit part, is the smallest. In addition, the passageway cross-sectional area described above refers to the cross-sectional area of a cross section that is orthogonal to the flow of the coolant inside the coolant passageway.

The second connecting part is preferably disposed such that it connects the coolant-transit part and the second coolant-transit part via the shortest distance, the same as the connecting parts are. In this situation, an increase in pressure loss that accompanies the reduction of the passageway cross-sectional area can be further curtailed while ensuring the cooling-performance improvement effect owing to the second connecting part.

The second coolant-transit part is preferably disposed such that it is spaced farther apart from the cooling-wall part than the coolant-transit parts. In this situation, for the same reasons as those in the situation in which the coolant-transit part is disposed such that it is spaced farther apart from the cooling-wall part than the coolant-contact parts as was described above, the cooling performance of the heat exchanger can be further improved.

The above-mentioned heat sink may have a plurality of fin plates stacked one on another, and the coolant passageway(s) may be formed between adjacent fin plates. In this situation, the coolant passageway(s) can be formed by performing the simple work of stacking the plurality of fin plates. For this reason, the manufacturing cost of the heat sink can be further reduced.

With regard to the heat sink comprising the plurality of fin plates, the degree of planarity of the edge surface of the heat sink on the side having the coolant-contact parts is preferably 0.2 mm or less. That is, when the edge surfaces of the fin plates on the side having the coolant-contact parts are all sandwiched between two planes that are parallel to one another, the spacing between the two planes would preferably be 0.2 mm or less. In this situation, when the cooling-wall part and the heat sink are to be brazed, filler can more easily be caused to penetrate between the cooling-wall part and the heat sink, and thereby the occurrence of joint defects, such as voids, can be more effectively curtailed.

The degree of planarity of the edge surface of the heat sink on the side having the coolant-contact parts can be measured specifically by the following method. First, the heat sink is placed on a baseplate, and the edge surface, of the pair of edge surfaces in the transverse direction of the fin plates, on the side that does not have the coolant-contact parts is brought into contact with the baseplate. Next, the height of the edge surfaces of the fin plates on the side having the coolant-contact parts are measured, using a height gauge, at various locations. Furthermore, the difference between the maximum height and the minimum height of the measurement results is taken as the degree of planarity of the edge surface of the heat sink on the side having the coolant-contact parts.

The heat sink may, for example, have first fin plates and second fin plates, which serve as the fin plates, and may have a layered structure in which the first fin plates and the second fin plates are stacked in an alternating manner. In such a heat sink, as each of the first fin plates, a fin plate can be used that has first reference-surface parts, first recessed parts, which are recessed in a first direction of the stacking direction relative to the first reference-surface parts, and first protruding parts, which protrude from the first reference-surface parts in a second direction that is a direction opposite that of the first direction, the first recessed parts and the first protruding parts being disposed in an alternating manner in the transverse direction and the longitudinal direction of the first fin plate. In addition, as each of the second fin plates, a fin plate can be used that has second reference-surface parts, second recessed parts, which are recessed in the above-mentioned first direction relative to the second reference-surface parts, and second protruding parts, which protrude from the second reference-surface parts in the above-mentioned second direction, the second recessed parts and the second protruding parts being disposed in an alternating manner in the transverse direction and the longitudinal direction of the second fin plate.

It is noted that the "longitudinal direction of the fin plate" described above refers to the lined-up direction of the coolant lead-in parts and the coolant lead-out parts, and the "transverse direction of the fin plate" refers to a direction that is orthogonal to both the stacking direction and the longitudinal direction.

When such first fin plates and the second fin plates are stacked such that the first recessed parts and the second protruding parts oppose one another and the second recessed parts and the first protruding parts oppose one another, coolant passageways, which include the spaces between the first recessed parts and the second protruding parts, are formed on the sides of the first fin plates on which the first protruding parts protrude. Furthermore, coolant passageways, which include the spaces between the second recessed parts and the first protruding parts, can be formed on the sides of the first fin plates on which the first recessed parts are recessed.

Accordingly, with regard to a heat sink having the above-mentioned specific structure, the spaces formed between adjacent fin plates can be reliably used as the coolant passageways. As a result, the surface area in which the heat sink and the coolant are in contact can be further enlarged, and thereby cooling performance can be further improved.

In the above-mentioned heat sink, gaps may be formed between the first protruding parts and the second recessed parts adjacent to the first protruding parts in the second direction, or the first protruding parts and the second recessed parts may be in contact with one another. In addition, the first recessed parts and the second protruding parts may be joined via joints such as brazed joints. From the viewpoint of curtailing the formation of unintended coolant paths between the first fin plates and the second fin plates, the first protruding parts and the second recessed parts adjacent to the first protruding parts in the second direction preferably are in contact and more preferably are joined via joints such as brazed joints.

Likewise, gaps may be formed between the second protruding parts and the first recessed parts disposed on the first-direction side of the second protruding parts, or the second protruding parts and the first recessed parts may be in contact with one another. In addition, the second protruding parts and the first recessed parts may be joined via joints such as brazed joints. From the viewpoint of curtailing the formation of unintended coolant paths between the first fin plates and the second fin plates, the second protruding parts and the first recessed parts, which are disposed on the first-direction side of the second protruding parts, preferably are in contact with one another and more preferably are joined via joints such as brazed joints.

In a heat sink having the above-mentioned specific structure, the first reference-surface parts are preferably disposed at portions surrounded by the first protruding parts and the first recessed parts, and the second reference-surface parts are preferably disposed at portions surrounded by the second protruding parts and the second recessed parts. In this situation, the coolant-contact parts and the coolant-transit parts described above can be formed in the spaces between the first recessed parts and the second protruding parts and between the second recessed parts and the first protruding parts, and the connecting parts can be formed between the first reference-surface parts and the second reference-surface parts. As a result, the above-mentioned coolant passageways can be formed more reliably.

The above-mentioned heat sink can be mounted on the cooling-wall part of the heat exchanger. For example, the heat exchanger may comprise a cooling jacket that has: an outer-wall part, which includes the cooling-wall part that cools a heat-generating body; an interior space, which is surrounded by the outer-wall part; a coolant inlet, which passes through the outer-wall part and through which the coolant is supplied from an exterior to the interior space; and a coolant outlet, which discharges the coolant from the interior space to the exterior. By housing the above-mentioned heat sink in the interior space of the cooling jacket, the cooling performance of the heat exchanger can be improved.

WORKING EXAMPLES

First Embodiment

Figure 2:
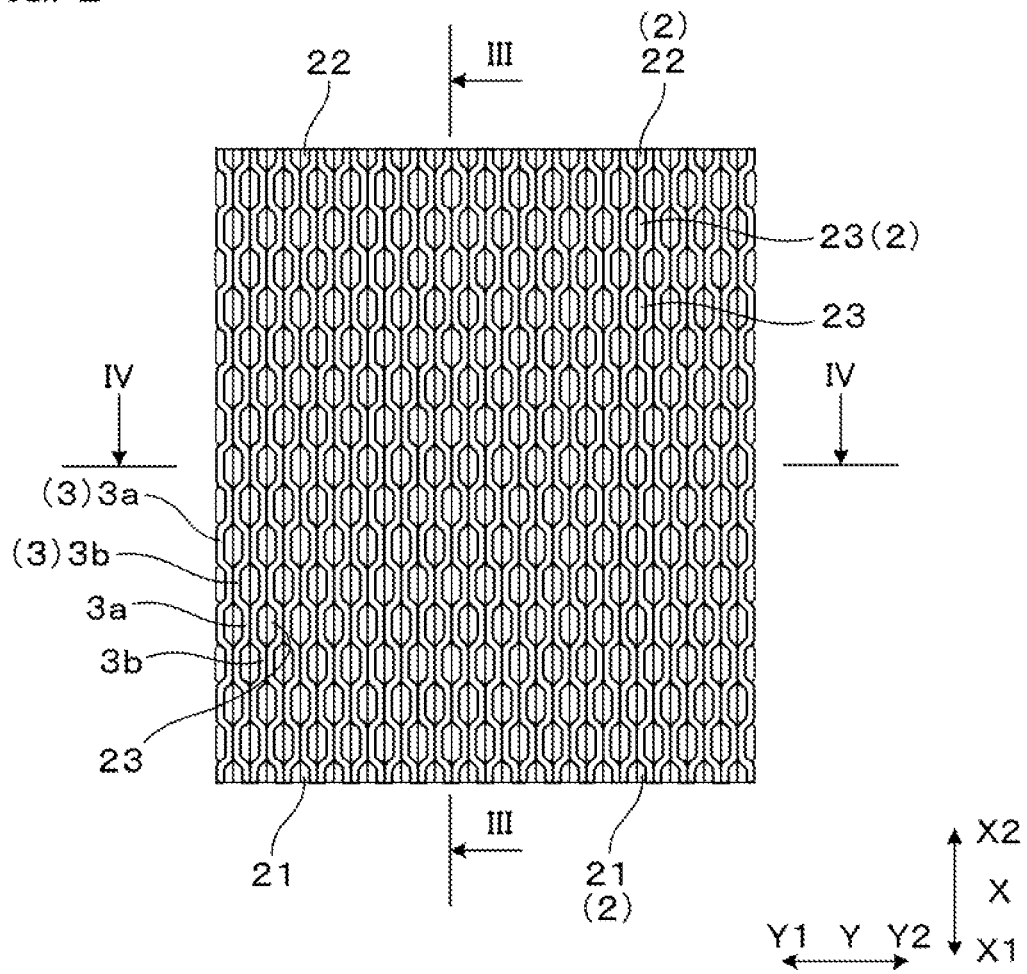
FIG. 2 is a top view of the heat sink according to the first embodiment.
Figure 3:
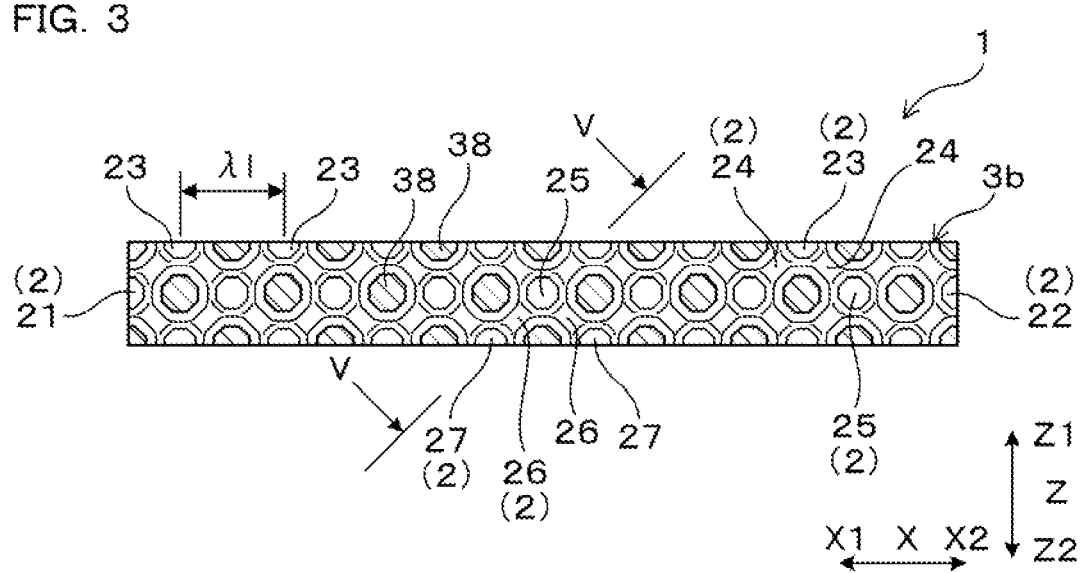
FIG. 3 is a cross-sectional view taken along line in FIG. 2.

Embodiments of the above-mentioned heat sink will now be explained, with reference to FIG. 1 to FIG. 7. A heat sink 1 (refer to FIG. 1) of the present embodiment is used in the state in which it is mounted on the cooling-wall part of the heat exchanger that cools the heat-generating body. As shown in FIG. 1 and FIG. 3, the heat sink 1 has coolant passageways 2, through which the coolant flows. As shown in FIG. 3, the coolant passageways 2 have coolant lead-in parts 21, into which the coolant is introduced, and coolant lead-out parts 22, from which the coolant is led out. In addition, a plurality of coolant-contact parts 23, a plurality of coolant-transit parts 25, and a plurality of connecting parts 24 are provided along the coolant paths leading from the coolant lead-in parts 21 to the coolant lead-outs part 22.

Figure 5:
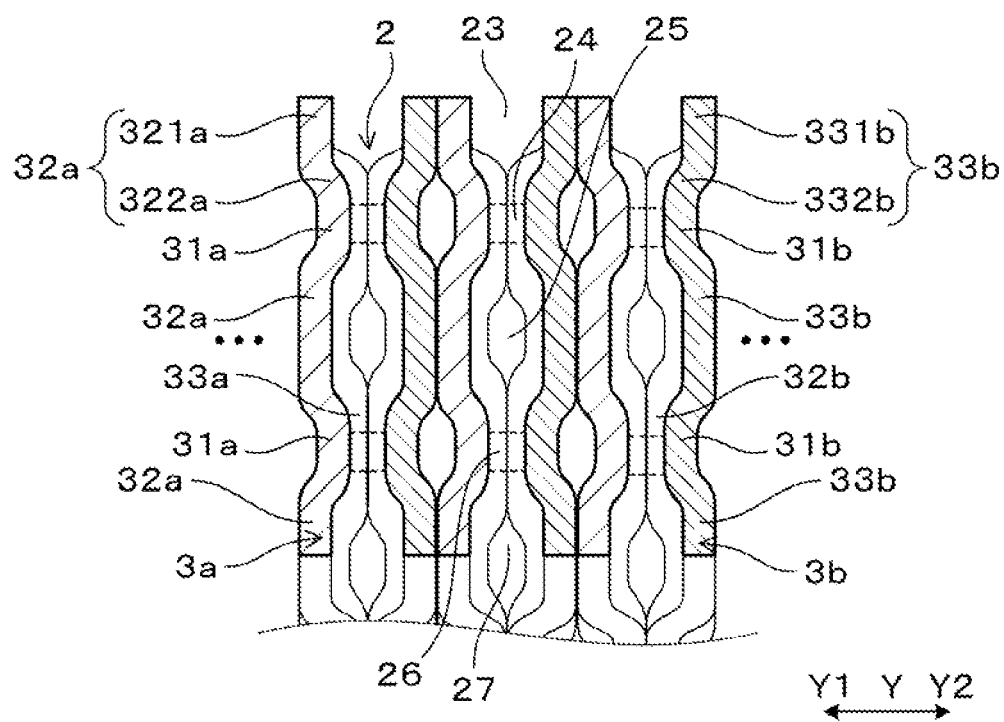
FIG. 5 is a partial, cross-sectional view taken along line V-V in FIG. 3.

The coolant-contact parts 23 are disposed spaced apart from one another along the coolant paths leading from the coolant lead-in parts 21 to the coolant lead-out parts 22 and are configured such that they can bring the coolant into contact the cooling-wall. The coolant-transit parts 25 are disposed between adjacent coolant-contact parts 23 and are configured such that the coolant can transit from an upstream-side coolant-contact part 23 to a downstream-side coolant-contact part 23 in the coolant path. As shown in FIG. 3 and FIG. 5, the connecting parts 24 are interposed between the coolant-transit parts 25 and the coolant-contact parts 23 and have a passageway cross-sectional area that is smaller than those of the coolant-contact part 23 and the coolant-transit part 25.

The specific configuration of the heat sink 1 of the present embodiment will now be explained in greater detail. As shown in FIG. 1 and FIG. 2, the heat sink 1 of the present embodiment comprises a plurality of fin plates 3 (3a, 3b), which are stacked, and the coolant passageways 2 are formed between adjacent fin plates 3. The outer dimension of the heat sink 1 in the stacking direction of the fin plates 3 is 54.4 mm.

A metal having high thermal conductivity, such as, for example, aluminum, an aluminum alloy, copper, a copper alloy, or the like, can be used as the material of the fin plates 3. Specifically, each of the fin plates 3 of the present embodiment is composed of a so-called two-sided brazing sheet, in which a filler material composed of an Al—Si (aluminum-silicon)-series alloy is layered on both surfaces of a core material composed of aluminum or an aluminum alloy.

Figure 6:
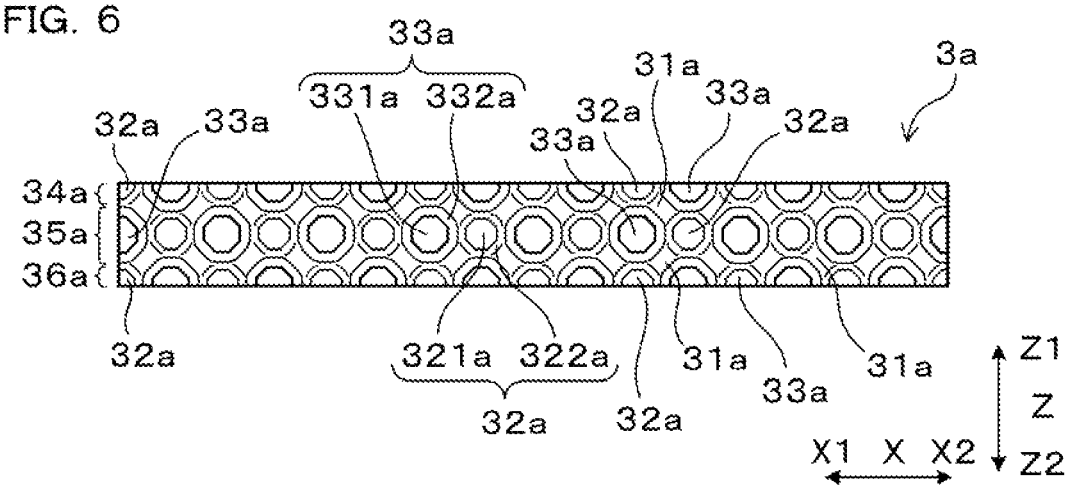
FIG. 6 is a plan view, viewed from a second direction, of a first fin plate according to the first embodiment.
Figure 7:
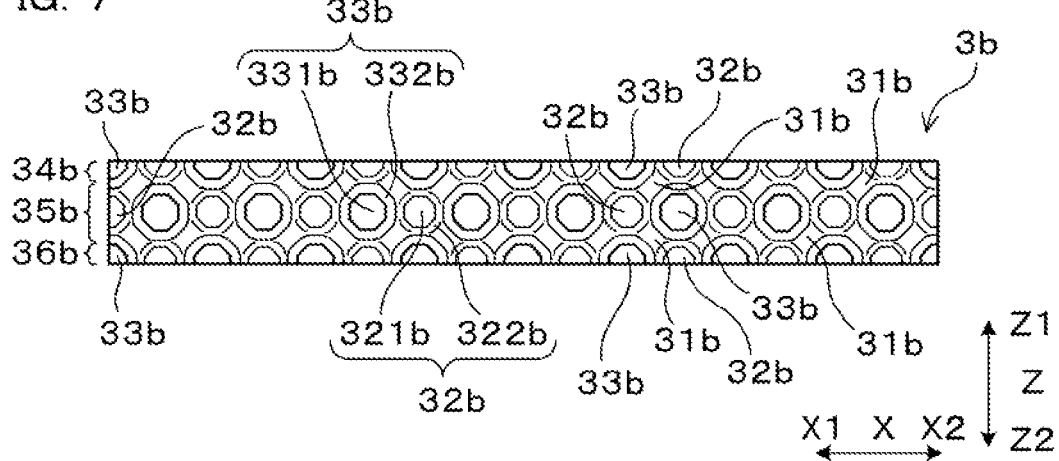
FIG. 7 is a plan view, viewed from the second direction, of a second fin plate according to the first embodiment.

As shown in FIG. 6 and FIG. 7, the fin plates 3 exhibit an oblong sheet shape. In addition, recesses and protrusions are imparted across the entirety of the fin plates 3 of the present embodiment in a longitudinal direction X, that is, in the lined-up direction of the coolant lead-in parts and the coolant lead-out parts, and in a transverse direction Z, that is, in the direction orthogonal to both a stacking direction Y and the longitudinal direction X of the fin plate 3. The length and the width of the fin plates 3 is not particularly limited. For example, the length of the fin plates 3 of the present embodiment is 64 mm, and the width is 8 mm.

The thickness of the fin plates 3 is preferably 0.6-1.5 mm. In this situation, a decrease in pressure loss and an improvement in cooling performance can coexist, and the recess-protrusion shape can be more easily imparted to the fin plates 3. Specifically, the thickness of the fin plates 3 of the present embodiment is 0.8 mm.

It is noted that, herein below, the coolant lead-in parts 21 side of the fin plates 3 in the longitudinal direction X is called "forward X1," and the coolant lead-out parts 22 side is called "rearward X2." In addition, the side of the fin plates 3 facing the cooling-wall part in the transverse direction Z is called "upward Z1," and the side opposite thereof is called "downward Z2." It is noted that, for the sake of convenience, the expressions relating to the directions described above have no relationship whatsoever to the orientation when the heat sink 1 is actually disposed.

More specifically, the heat sink 1 of the present embodiment comprises first fin plates 3a and second fin plates 3b as the fin plates 3. As shown in FIG. 1 and FIG. 2, the first fin plates 3a and the second fin plates 3b are stacked in an alternating manner in the heat sink 1 of the present embodiment.

As shown in FIG. 5 and FIG. 6, each of the first fin plates 3a comprises: first reference-surface parts 31a, which exhibit a flat-sheet shape; first recessed parts 32a, which are recessed in a first direction Y1 of the stacking direction Y relative to the first reference-surface parts 31a; and first protruding parts 33a, which protrude from the first reference-surface parts 31a in a second direction Y2, which is the direction opposite that of the first direction Y1. As shown in FIG. 6, the first recessed parts 32a and the first protruding parts 33a are disposed in an alternating manner in the longitudinal direction X and the transverse direction Z of the first fin plate 3a.

More specifically, the first fin plates 3a of the present embodiment have three recesses-and-protrusions rows: an upper-level, recesses-and-protrusions row 34a, in which the first recessed parts 32a and the first protruding parts 33a are provided in an alternating manner along the upward Z1 side of the transverse direction Z; a lower-level, recesses-and-protrusions row 36a, in which they are provided along the downward Z2 side; and a mid-level, recesses-and-protrusions row 35a, in which they are provided between the upper-level, recesses-and-protrusions row 34a and the lower-level, recesses-and-protrusions row 36a. The first recessed parts 32a are disposed most forward X1 of the upper-level, recesses-and-protrusions row 34a and the lower-level, recesses-and-protrusions row 36a, and the first protruding parts 33a are disposed most forward X1 of the mid-level, recesses-and-protrusions row 35a.

In plan view when viewed from the stacking direction Y, the first reference-surface parts 31a are disposed at portions surrounded by the first recessed parts 32a and the first protruding parts 33a. Although not shown in the drawings, in plan view when viewed from the stacking direction Y, the first reference-surface parts 31a exhibit an oblong shape extending in a direction that is tilted 45° relative to the longitudinal direction X.

Figure 4:
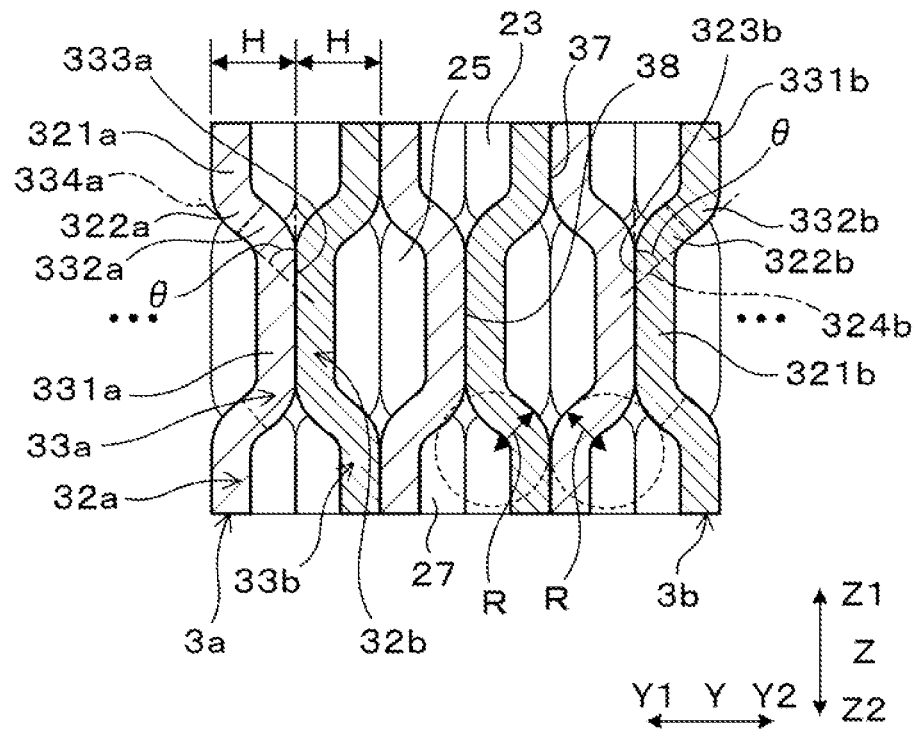
FIG. 4 is a partial, cross-sectional view taken along line IV-IV in FIG. 2.

As shown in FIG. 4, when the thickness of the first fin plates 3a is represented as t [mm], the outer dimension H [mm] of the first fin plate 3a in the stacking direction Y is preferably $1.0 \leq H/t \leq 7.0$. In this situation, formation defects can be curtailed, the depth of the first recessed parts 32a and the height of the first protruding parts 33a can be made sufficiently large, and the heat-transfer surface area can be further enlarged. As a result, cooling performance can be further improved. Specifically, the outer dimension H of the first fin plates 3a of the present embodiment in the stacking direction Y is 1.7 mm.

As shown in FIG. 5, a bottom part 321a of the first recessed parts 32a is a portion that is recessed most on the first direction Y1 side and exhibits a flat-sheet shape that is parallel to the first reference-surface parts 31a. In addition, as shown in FIG. 6, the bottom part 321a of the first recessed part 32a, from among the plurality of first recessed parts 32a, that is provided along the first fin plates 3a side exhibits a shape that forms a portion of an octagonal shape in plan view when viewed from the stacking direction Y, and the bottom part 321a of the first recessed part 32a that is provided inward of the first fin plates 3a side exhibits a complete octagonal shape.

As shown in FIG. 4, a perimetric-edge portion 322a of the bottom parts 321a exhibits a smooth curved-surface shape and is connected to a perimetric-edge portion 332a (described below) of a peak part 331a of the first protruding part 33a. An outer-side bend radius R of the perimetric-edge portion 322a of the bottom parts 321a shown in FIG. 4 is preferably 1.0-3.0 mm. In this situation, formation defects can be curtailed, and a decrease in pressure loss and an improvement in cooling performance can coexist. Specifically, the outer-side bend radius R of the perimetric-edge portion 322a of the bottom parts 321a of the first fin plates 3a in the present embodiment is 1.3 mm.

The first protruding parts 33a have a shape that is the inverse of the recessed shape of the first recessed part 32a. Although not shown in the drawings, the peak part 331a of the first protruding parts 33a, that is, the portion that protrudes the most on the second direction Y2 side, exhibits a flat-sheet shape that is parallel to the first reference-surface parts 31a, the same as that of the bottom part 321a of the first recessed parts 32a. In addition, as shown in FIG. 6, the peak part 331a of the first protruding parts 33a, from among the plurality of first protruding parts 33a, that is provided along the first fin plates 3a side exhibits a shape that forms a portion of an octagonal shape in plan view when viewed from the stacking direction Y, and the peak part 331a of the first protruding parts 33a provided inward of the first fin plates 3a side exhibits a complete octagonal shape.

As shown in FIG. 4, the perimetric-edge portion 332a of the peak parts 331a exhibits a smooth curved-surface shape and is connected to the perimetric-edge portion 322a of the bottom part 321a of the first recessed parts 32a. Although not shown in the drawings, the outer-side bend radius of the perimetric-edge portion 332a of the peak parts 331a is preferably 1.0-3.0 mm, the same as that of the bottom part 321a of the first recessed parts 32a. Specifically, the outer-side bend radius of the perimetric-edge portion 332a of the peak parts 331a of the first fin plates 3a of the present embodiment is 1.3 mm.

The shape angle θ of the first fin plates 3a shown in FIG. 4 is preferably 30°-60°. In this situation, formation defects can be curtailed, and a decrease in pressure loss and an improvement in cooling performance can coexist. It is noted that the shape angle θ described above, specifically as shown in FIG. 4, is an angle that, in a cross section in the transverse direction Z that passes through the center of the first recessed parts 32a, is formed by a surface 333a of the peak part 331a of the first protruding part 33a in the second direction Y2 and a tangent 334a that passes through the boundary of the surface of the first fin plate 3a in the first direction Y1 between the perimetric-edge portion 322a of the first recessed part 32a and the perimetric-edge portion 332a of the first protruding part 33a.

In addition, instead of the angle formed by the surface 333a and the tangent 334a described above, an angle—that, in a cross section in the transverse direction Z that passes through the center of the first recessed parts 32a, is formed by the surface of the bottom part 321a of the first recessed part 32a in the first direction Y1 and a tangent that passes through the boundary, on the surface of the first fin plate 3a in the second direction Y2, between the perimetric-edge portion 322a of the first recessed part 32a and the perimetric-edge portion 332a of the first protruding part 33a—can also be taken as the shape angle θ. Specifically, the shape angle θ of the first fin plates 3a of the present embodiment is 60°.

As shown in FIG. 5 and FIG. 7, the second fin plates 3b have: second reference-surface parts 31b, which exhibit a flat-sheet shape; second recessed parts 32b, which are recessed in the first direction Y1 relative to the second reference-surface parts 31b; and second protruding parts 33b, which protrude in the second direction Y2 from the second reference-surface parts 31b. As shown in FIG. 7, the second recessed parts 32b and the second protruding parts 33b are disposed in an alternating manner in the longitudinal direction X and the transverse direction Z of the second fin plates 3b.

More specifically, the second fin plates 3b of the present embodiment have a shape that is the inverse of the recesses and protrusions of the first fin plates 3a. That is, the second fin plates 3b have three recesses-and-protrusions rows: an upper-level, recesses-and-protrusions row 34b in which the second recessed parts 32b and the second protruding parts 33b are provided in an alternating manner along the upward Z1 side of the transverse direction Z; a lower-level, recesses-and-protrusions row 36b, which is provided along the downward Z2 side; and a mid-level, recesses-and-protrusions row 35b, which is provided between the upper-level, recesses-and-protrusions row 34b and the lower-level, recesses-and-protrusions row 36b. Most forward X1 of the upper-level, recesses-and-protrusions row 34b and the lower-level, recesses-and-protrusions row 36b are disposed the second protruding parts 33b, and most forward X1 of the mid-level, recesses-and-protrusions row 35b is disposed the second recessed part 32b.

In plan view when viewed from the stacking direction Y, the second reference-surface parts 31b are disposed at portions surrounded by the second recessed parts 32b and the second protruding parts 33b. Although not shown in the drawings, in plan view when viewed from the stacking direction Y, the second reference-surface parts 31b exhibit an oblong shape extending in a direction that is tilted by 45° relative to the longitudinal direction X.

As shown in FIG. 4, when the thickness of the second fin plates 3b is represented as t [mm], the outer dimension H [mm] of the second fin plates 3b in the stacking direction Y is preferably 1.0≤H/t≤7.0, the same as that of the first fin plates 3a. In this situation, formation defects can be curtailed, and the depth of the second recessed parts 32b and the height of the second protruding parts 33b can be made sufficiently large, and thereby the heat-transfer surface area can be further enlarged. As a result, cooling performance can be further improved. Specifically, the outer dimension H of the second fin plates 3b of the present embodiment in the stacking direction Y is 1.7 mm.

Although not shown in the drawings, a bottom part 321b (refer to FIG. 4) of the second recessed parts 32b, that is, a portion that is recessed most on the first direction Y1 side, exhibits a flat-sheet shape that is parallel to the second reference-surface parts 31b. In addition, as shown in FIG. 7, in plan view when viewed from the stacking direction Y, the bottom part 321b of the second recessed parts 32b exhibits a shape that forms a complete octagonal shape or a portion of an octagonal shape. A peak part 331b of the second protruding parts 33b, that is, a portion that protrudes the most on the second direction Y2 side, exhibits a flat-sheet shape that is parallel to the second reference-surface parts 31b, the same as that of the bottom part 321b of the second recessed parts 32b, and, in plan view when viewed from the stacking direction Y, exhibits a shape that forms a complete octagonal shape or a portion of an octagonal shape.

As shown in FIG. 4, a perimetric-edge portion 322b of the bottom part 321b of the second recessed parts 32b and a perimetric-edge portion 332b of the peak part 331b of the second protruding parts 33b exhibit a smooth curved-surface shape, and the perimetric-edge portion 322b of the bottom part 321b and the perimetric-edge portion 332b of the peak part 331b adjacent thereto are connected. The outer-side bend radius R of the perimetric-edge portion 322b of the bottom parts 321b and the perimetric-edge portion 332b of the peak parts 331b is preferably 1.0-3.0 mm. In this situation, formation defects can be curtailed, and a decrease in pressure loss and an improvement in cooling performance can coexist. Specifically, in the second fin plates 3b of the present embodiment, the outer-side bend radius R of the perimetric-edge portion 322b of the bottom parts 321b and the perimetric-edge portion 332b of the peak parts 331b is 1.3 mm.

In addition, the shape angle θ of the recesses-and-protrusions shape of the second fin plates 3b is preferably 30°-60°, the same as that of the first fin plates 3a. In this situation, formation defects can be curtailed, and a decrease in pressure loss and an improvement in cooling performance can coexist. It is noted that the shape angle θ described above, specifically as shown in FIG. 4, is an angle that, in a cross section in the transverse direction Z that passes through the center of the second recessed parts 32b, is formed by a surface 323b of the bottom part 321b of the second recessed part 32b in the first direction Y1 and a tangent 324b that passes through the boundary of the surface of the second fin plate 3b in the second direction Y2 between the perimetric-edge portion 322b of the second recessed part 32b and the perimetric-edge portion 332b of the second protruding part 33b.

In addition, instead of the angle formed by the surface 323b and the tangent 324b described above, an angle—that, in a cross section in the transverse direction Z that passes through the center of the second recessed parts 32b, is formed by the surface of the peak part 331b of the second protruding parts 33b in the second direction Y2 and the tangent that passes through the boundary, on the surface of the second fin plate 3b in the first direction Y1, between the perimetric-edge portion 322b of the second recessed part 32b and the perimetric-edge portion 332b of the second protruding part 33b—can also be taken as the shape angle θ. Specifically, the shape angle θ of each of the second fin plates 3b of the present embodiment is 60°.

As shown in FIG. 4, in the heat sink 1 of the present embodiment, the first recessed parts 32a of the first fin plates 3a and the second protruding parts 33b of the second fin plates 3b adjacent to the first fin plates 3a are opposing, and the second recessed parts 32b of the second fin plates 3b and the first protruding parts 33a of the first fin plates 3a adjacent to the second fin plates 3b are opposing. In addition, as shown in FIG. 4, the bottom parts 321a of the first recessed parts 32a and the peak parts 331b of the second protruding parts 33b adjacent to the bottom parts 321a in the first direction Y1 are joined via brazed joints 37, and the peak parts 331a of the first protruding parts 33a and the bottom parts 321b of the second recessed parts 32b adjacent to the peak parts 331a in the second direction Y2 are joined via brazed joints 38.

Thereby, as shown in FIG. 3 and FIG. 5, coolant passageways 2, which include the spaces between the first recessed parts 32a and the second protruding parts 33b and the spaces between the first reference-surface parts 31a and the second reference-surface parts 31b, are formed between the first fin plates 3a and the second fin plates 3b that are adjacent to the first fin plates 3a in the second direction Y2. In addition, although not shown in the drawings, coolant passageways 2, which include the spaces between the second recessed parts 32b and the first protruding parts 33a and the spaces between the first reference-surface parts 31a and the second reference-surface parts 31b, are formed between the first fin plates 3a and the second fin plates 3b that are adjacent to the first fin plates 3a in the first direction Y1.

As described above, the coolant passageways 2 of the present embodiment are formed between adjacent fin plates 3. Specifically as shown in FIG. 3, the coolant lead-in parts 21 of the coolant passageways 2 of the present embodiment are composed of the spaces between the first recessed parts 32a provided along the forward X1 side of the first fin plate 3a and the second protruding parts 33b adjacent to the first recessed parts 32a in the second direction Y2 and the spaces between the first protruding parts 33a provided along the forward X1 side of the first fin plate 3a and the second recessed parts 32b adjacent to the first protruding parts 33a in the first direction Y1.

Specifically, the coolant lead-out parts 22 of the present embodiment are composed of the spaces between the first recessed parts 32a provided along the rearward X2 side of the first fin plate 3a and the second protruding parts 33b adjacent to the first recessed parts 32a in the second direction Y2 and the spaces between the first protruding parts 33a provided along the rearward X2 side of the first fin plate 3a and the second recessed parts 32b adjacent to the first protruding parts 33a in the first direction Y1.

Specifically, the coolant-contact parts 23 of the present embodiment are composed of the spaces between the upper-level, recesses-and-protrusions row 34a of the first fin plate 3a and the upper-level, recesses-and-protrusions row 34b of the second fin plate 3b. In addition, the coolant-contact parts 23 are disposed on the upward Z1 end surface of the heat sink 1 and are configured such that the coolant can be supplied directly to the cooling-wall part.

The coolant-contact parts 23 in the coolant passageways 2 can be disposed such that, for example, they satisfy Equation (1) below. Therein, $\lambda_I$ in Equation (1) below is the pitch (refer to FIG. 3) between the coolant-contact parts 23 in the longitudinal direction X; L is the dimension of the heat sink 1 in the longitudinal direction X; and n is a natural number.

$$n\lambda_I/2=L \qquad (1)$$

Specifically, the pitch $\lambda_1$ between the coolant-contact parts 23 of the present embodiment is 8.0 mm. The coolant-contact parts 23 of the present embodiment are disposed such that they satisfy the above-mentioned Equation (1) when the value of n is 16.

The coolant-transit parts 25 of the present embodiment are disposed such that they are spaced farther apart, downward Z2, from the cooling-wall part than the coolant-contact parts 23. Specifically as shown in FIG. 5, the coolant-transit parts 25 are spaces between the mid-level, recesses-and-protrusions row 35a of the first fin plate 3a and the mid-level, recesses-and-protrusions row 35b of the second fin plate 3b.

Specifically as shown in FIG. 5, the connecting parts 24 of the present embodiment include the spaces between the first reference-surface parts 31a that exist between the upper-level, recesses-and-protrusions row 34a and the mid-level, recesses-and-protrusions row 35a of the first fin plate 3a and the second reference-surface parts 31b that exist between the upper-level, recesses-and-protrusions row 34b and the mid-level, recesses-and-protrusions row 35b of the second fin plate 3b. The connecting parts 24 of the present embodiment provide connections rectilinearly, that is, by the shortest distance, between the coolant-contact parts 23 and the coolant-transit parts 25.

The connecting parts 24 preferably extend in a direction that is tilted relative to the longitudinal direction X of the fin plates 3. In this situation, pressure loss when the coolant is flowing can be further reduced while maintaining cooling performance. From the viewpoint of enabling high cooling performance and low pressure loss to coexist, the tilt of the extension direction of the connecting parts 24 relative to the longitudinal direction X is preferably 20°-70°, more preferably 30°-60°, and yet more preferably 40°-50°. Specifically, the connecting parts 24 of the present embodiment extend in a direction that is tilted by 45° relative to the longitudinal direction X of the corresponding fin plates 3.

In addition, the coolant passageways 2 of the present embodiment further have: second coolant-transit parts 27, which are disposed between adjacent coolant-transit parts 25 and through which the coolant transits from upstream-side coolant-transit parts 25 to downstream-side coolant-transit parts 25 in the coolant path; and second connecting parts 26, which are interposed between the second coolant-transit parts 27 and the coolant-transit parts 25 and whose passageway cross-sectional areas are smaller than those of the coolant-transit parts 25 and the second coolant-transit parts 27.

Specifically as shown in FIG. 5, the second coolant-transit parts 27 of the present embodiment are the spaces between the lower-level, recesses-and-protrusions row 36a of the first fin plates 3a and the lower-level, recesses-and-protrusions row 36b of the second fin plate 3b.

Specifically, the second connecting parts 26 of the present embodiment include the spaces between the first reference-surface parts 31a existing between the mid-level, recesses-and-protrusions row 35a and the lower-level, recesses-and-protrusions row 36a of the first fin plates 3a and the second reference-surface parts 31b existing between the upper-level, recesses-and-protrusions row 34b and the mid-level, recesses-and-protrusions row 35b of the second fin plate 3b. The second connecting parts 26 of the present embodiment provide connections rectilinearly, that is, by the shortest distance, between the coolant-transit parts 25 and the second coolant-transit parts 27.

The same as the connecting parts 24, the second connecting parts 26 preferably extend in a direction that is tilted relative to the longitudinal direction X of the fin plates 3. In this situation, pressure loss when the coolant is flowing can be further reduced while maintaining cooling performance. From the viewpoint of enabling high cooling performance and low pressure loss to coexist, the tilt in the extension direction of each of the second connecting parts 26 relative to the longitudinal direction X is preferably 20°-70°, more preferably 30°-60°, and yet more preferably 40°-50°. Specifically, the second connecting parts 26 of the present embodiment extend in a direction that is tilted by 45° relative to the longitudinal direction X of the fin plates 3.

The heat sink 1 of the present embodiment has the coolant passageways 2, which comprise: the plurality of coolant-contact parts 23 disposed between the coolant lead-in parts 21 and the coolant lead-out parts 22; the coolant-transit parts 25, through which the coolant transits from upstream-side coolant-contact parts 23 to downstream-side coolant-contact parts 23 in the coolant paths; and the connecting parts 24 interposed between the coolant-transit parts 25 and the coolant-contact parts 23. In addition, the connecting parts 24 have a passageway cross-sectional area that is smaller than those of the coolant-contact parts 23 and the coolant-transit parts 25.

The flow of the coolant inside the coolant passageways 2 of the heat sink 1 of the present embodiment is as, for example, below. The coolant that flows into the passageways from the coolant lead-in parts 21 is guided from the coolant lead-in parts 21 to the coolant-contact parts 23. Then, the coolant, which has undergone heat exchange with the cooling-wall part or the like of the heat exchanger in the coolant-contact parts 23, flows into the coolant-transit parts 25 through the interior of the connecting parts 24. Because the passageway cross-sectional area of the connecting parts 24 is smaller than those of the coolant-contact parts 23 and the coolant-transit parts 25, the coolant that flows into the interior of the coolant-transit parts 25 is agitated owing to the increase/decrease of the size of the passageways. In addition, the coolant that flows from the coolant-transit parts 25 into the coolant-contact parts 23 via the connecting parts 24 likewise is agitated, the same as mentioned above, owing to the difference in the passageway cross-sectional areas between the connecting parts 24 on one hand and the coolant-contact parts 23 and the coolant-transit parts 25 on the other hand.

Accordingly, with regard to the heat sink 1, owing to the connecting parts 24 being provided between the coolant-contact parts 23 and the coolant-transit parts 25, the coolant that flows through the interior of the coolant passageways 2 is agitated with good efficiency, and thereby bias in the temperature of the coolant in the interior of the coolant passageways 2 can be reduced. Thereby, the temperature difference between the coolant, which contacts the heat sink 1, and the heat sink 1 can be made larger. As a result, the cooling performance of the heat exchanger can be improved.

In addition, the coolant passageways 2 have: the second coolant-transit parts 27, which are disposed between adjacent coolant-transit parts 25 and through which the coolant transits from upstream-side coolant-transit parts 25 to downstream-side coolant-transit parts 25 in the coolant paths; and the second connecting parts 26, which are interposed between the second coolant-transit parts 27 and the coolant-transit parts 25 and whose passageway cross-sectional areas are smaller than those of the coolant-transit parts 25 and the second coolant-transit parts 27. Consequently, the coolant can be agitated in the second coolant-transit parts 27, the same as in the coolant-contact parts 23. Furthermore, the flow of the coolant that flows in from the coolant-contact parts 23 via the connecting parts 24 and the flow of the coolant that flows in from the second coolant-transit parts 27 via the second connecting parts 26 are caused to merge in the coolant-transit parts 25, and thereby the coolant can be agitated more effectively. As a result, the cooling performance of the heat exchanger can be further improved.

In addition, in the present embodiment, the perimetric-edge portion 322a of the first recessed parts 32a, the perimetric-edge portion 332a of the first protruding parts 33a, the perimetric-edge portion 322b of the second recessed parts 32b, and the perimetric-edge portion 332b of the second protruding parts 33b are all configured as smooth curved surfaces. Thereby, at every location of the coolant passageways 2, the inner surfaces of the heat sink 1 are tilted relative to a plane that is orthogonal to the flow direction of the coolant. That is, the inner surfaces of the heat sink 1 do not have a plane that is orthogonal to the flow direction of the coolant.

Thus, owing to the heat sink 1 being configured such that the inner surfaces thereof do not have a plane that is orthogonal to the flow direction of the coolant, the flow resistance of the coolant can be further reduced. As a result, pressure loss can be further reduced.

Second Embodiment

In the present embodiment, a fin plate 302 will be explained, wherein the range over which the recesses-and-protrusions shape is imparted has been modified. It is noted that, from among the symbols used in embodiments subsequent to the present embodiment, symbols that are identical to those in the previous embodiments indicate, unless otherwise specified, structural elements that are the same as those in the previous embodiments.

In the first embodiment, the first fin plates 3a and the second fin plates 3b were described, in which recessed parts 32 (the first recessed parts 32a and the second recessed parts 32b) and protruding parts 33 (the first protruding parts 33a and the second protruding parts 33b) are provided over the entirety in the longitudinal direction X and the transverse direction Z; however, the recessed parts 32 and the protruding parts 33 may be provided on a portion of the fin plates 3. It is noted that the recessed parts 32 are portions that are recessed relative to a reference surface portion 31, and the protruding parts 33 are portions that protrude relative to the reference surface portion 31.

Figure 8:
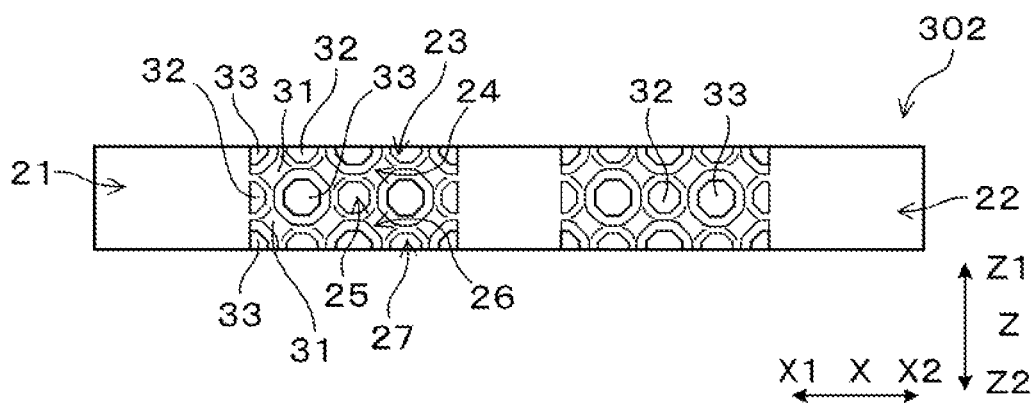
FIG. 8 is a plan view, viewed from the second direction, of the first fin plate, to which recesses and protrusions have been imparted to a portion in a longitudinal direction, according to a second embodiment.

For example, as shown in FIG. 8, the recessed parts 32 and the protruding parts 33 may be provided on a portion of the fin plate 302 in the longitudinal direction X. For example, by providing the recessed parts 32 and the protruding parts 33 directly below the location at which the heat-generating body is expected to be placed, an increase in pressure loss due to the recesses-and-protrusions shape can be curtailed while ensuring sufficient cooling performance.

Third Embodiment

Figure 9:
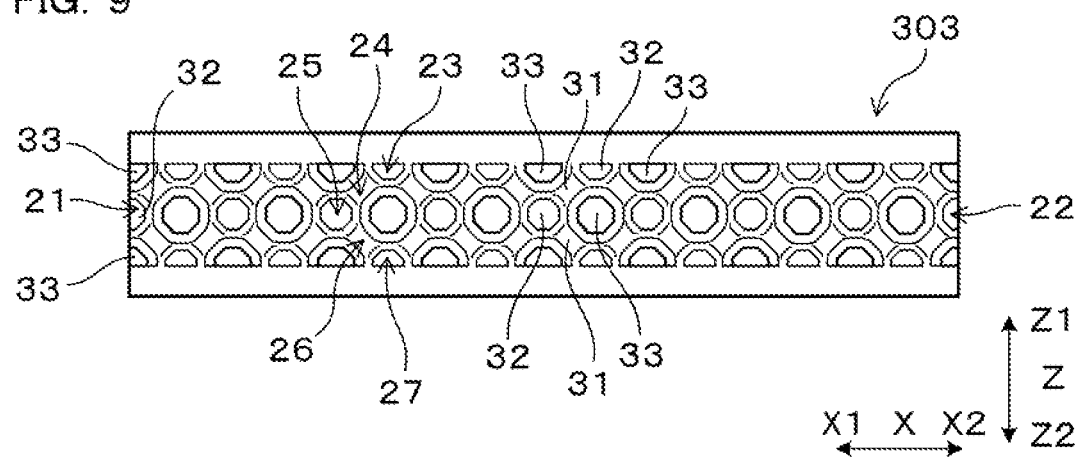
FIG. 9 is a plan view, viewed from the second direction, of the first fin plate, to which recesses and protrusions have been imparted to a portion in a transverse direction, according to a third embodiment.

In the present embodiment, yet another embodiment of a fin plate 303 will be explained, wherein the range over which the recesses-and-protrusions shape is imparted has been modified. For example, as shown in FIG. 9, the recessed parts 32 and the protruding parts 33 may be provided on a portion of the fin plate 303 in the transverse direction Z. In this situation as well, the cooling performance due to the recesses-and-protrusions shape can be increased, and an increase in the pressure loss due to the recesses-and-protrusions shape can be curtailed.

Fourth Embodiment

Figure 10:
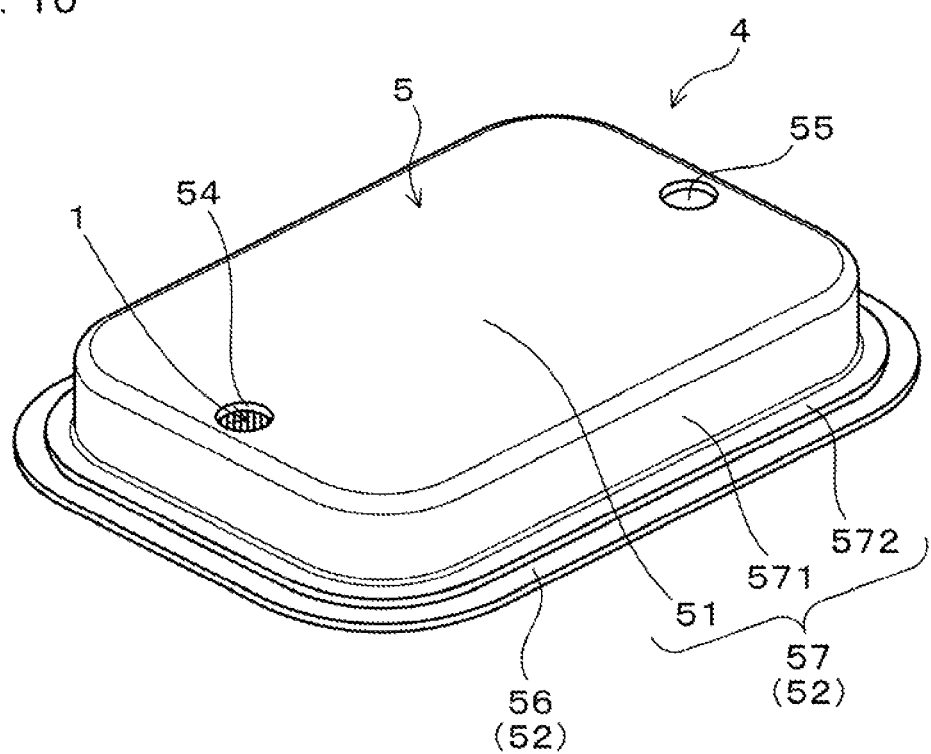
FIG. 10 is an oblique view of a heat exchanger according to a fourth embodiment.
Figure 11:
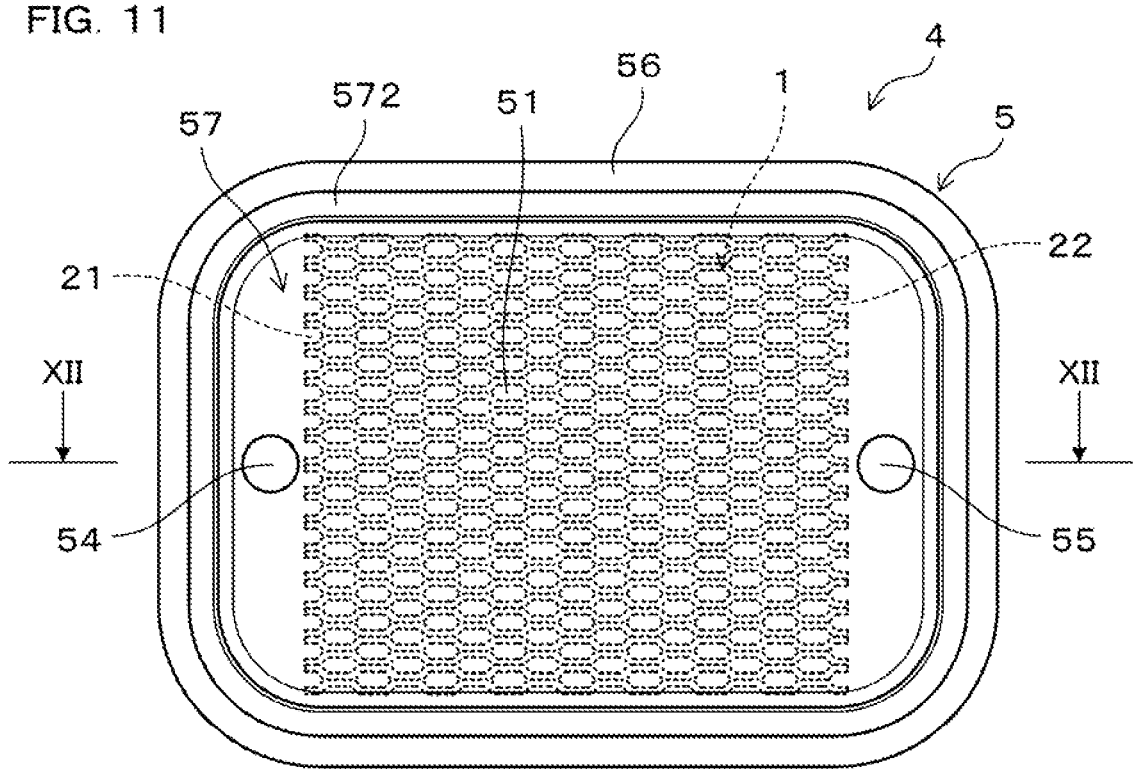
FIG. 11 is a top view of the heat exchanger according to the fourth embodiment.
Figure 12:
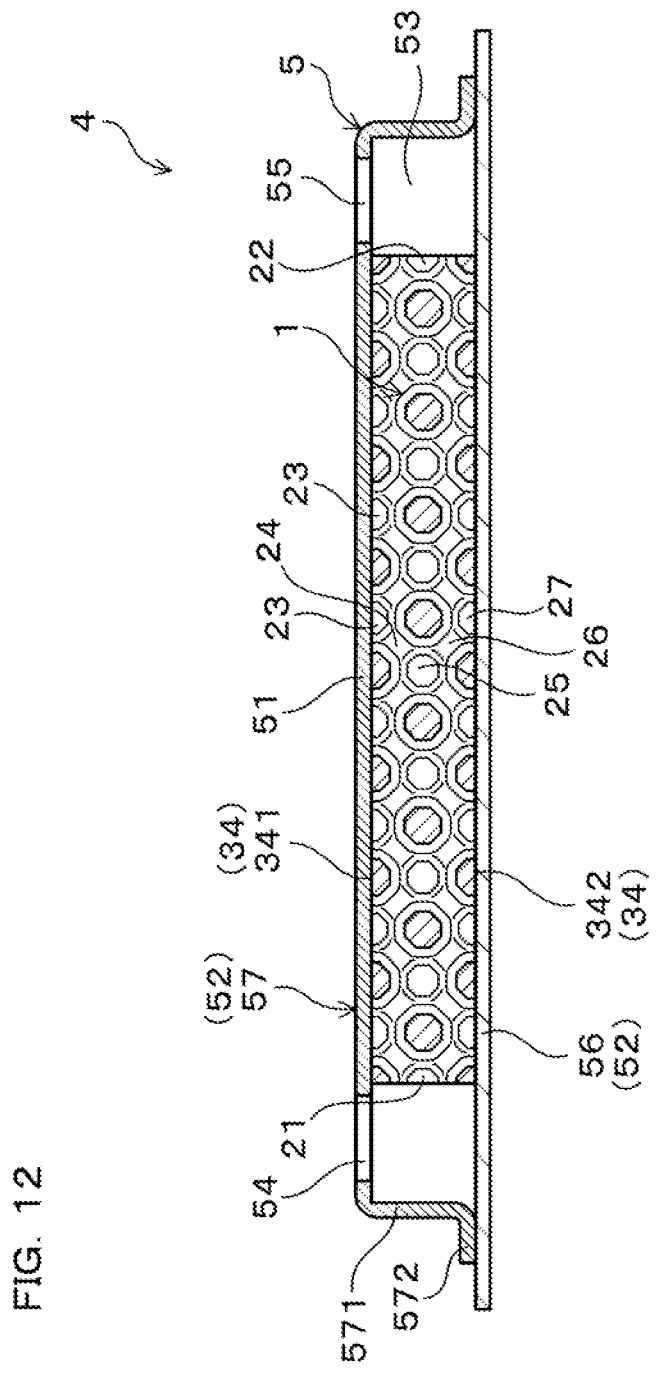
FIG. 12 is a cross-sectional view taken along line XII-XII in FIG. 11.

In the present embodiment, a heat exchanger 4, which comprises the heat sink 1, will be explained. As shown in FIG. 10 to FIG. 12, the heat exchanger 4 comprises the heat sink 1 and a cooling jacket 5. As shown in FIG. 10 and FIG. 12, the cooling jacket 5 has: an outer-wall part 52, which includes a cooling-wall part 51 that cools the heat-generating body; an interior space 53, which is surrounded by the outer-wall part 52; a coolant inlet 54, which passes through the outer-wall part 52 and through which the coolant is supplied from the exterior of the heat exchanger 4 to the interior space 53; and a coolant outlet 55, from which the coolant is discharged from the interior space 53 to the exterior of the heat exchanger 4. The heat sink 1 is housed in the interior space 53 of the cooling jacket 5.

As shown in FIG. 10 and FIG. 11, the outer-wall part 52 of the cooling jacket 5 comprises a cover part 56, which exhibits substantially an oblong shape, and a cap part 57, which is installed on the cover part 56. As shown in FIG. 10 and FIG. 12, the cap part 57 has: the cooling-wall part 51, which is disposed facing the cover part 56 and exhibits a substantially oblong shape; a sidewall part 571, which extends from an outer-perimetric end edge of the cooling-wall part 51 toward the cover part 56 side; and a flange part 572, which is formed on the tip of the sidewall part 571 and is joined to the cover part 56. It is noted that the joining of the cover part 56 and the flange part 572 can be performed by a method such as, for example, brazing, welding, and friction-stir welding.

The coolant inlet 54 and the coolant outlet 55 are provided at center portions of the two short sides of the outer-perimetric edge part of the cooling-wall part 51.

As shown in FIG. 12, the heat sink 1 is disposed in the interior space 53 of the cooling-wall part 51, which is surrounded by the cover part 56 and the cap part 57. The heat sink 1 is disposed such that the coolant lead-in parts 21 of the coolant passageways 2 face the coolant inlet 54 side of the cooling jacket 5, and the coolant lead-out parts 22 of the coolant passageways 2 face the coolant outlet 55 side of the cooling jacket 5.

As shown in FIG. 12, in the present embodiment, both edge surfaces 34 (341, 342) of the fin plates 3 in the transverse direction Z are joined, via brazed joints, to the inner surface of the cooling-wall part 51 or the inner surface of the cover part 56.

In the situation in which the heat sink 1, which comprises the plurality of fin plates 3 as in the present embodiment, is brazed to the cooling jacket 5, it is preferable to make the degree of planarity of the edge surface of the heat sink 1 on the side that has the coolant-contact parts 23 and the edge surface of the heat sink 1 on the side that does not have the coolant-contact parts 23 be 0.2 mm or less. In this situation, when the cooling jacket 5 and the heat sink 1 are to be brazed, filler can be more easily cause to penetrate into the spaces between the cooling jacket 5 and the heat sink 1, and thereby the occurrence of joint defects, such as voids, can be curtailed more effectively.

It is noted that the degree of planarity of the edge surface of the heat sink 1 on the side that does not have the coolant-contact parts 23 can be measured by the same method for measuring the degree of planarity of the edge surface of the heat sink 1 on the side that does have the coolant-contact parts 23, as described above. That is, the heat sink 1 is placed on the baseplate, and the edge surface 341, from among the two edge surfaces 34 of the fin plate 3 in the transverse direction Z, on the side that has the coolant-contact parts 23 is brought into contact with the baseplate. Then, the height of the edge surface 342 on the side of the heat sink 1 that does not have the coolant-contact parts 23 is measured at various locations using a height gauge. Furthermore, the difference between the maximum height and the minimum height from among the measurement results is taken as the degree of planarity of the edge surface of the heat sink 1 on the side that does not have the coolant-contact parts 23.

Because the heat exchanger 4 of the present embodiment has the above-mentioned configuration, the coolant that flows from the coolant inlet 54 into the interior space 53 can be guided into the coolant passageways 2 via the coolant lead-in parts 21 of the heat sink 1. In addition, as described above, the coolant inside the coolant passageways 2 can undergo heat exchange with the cooling-wall part 51 in the coolant-contact parts 23 while the coolant is being agitated by the connecting parts 24, the coolant-transit parts 25, the second connecting parts 26, and the second coolant-transit parts 27. Then, the coolant that reaches the coolant lead-out parts 22 is discharged via the coolant outlet 55. Thereby, the heat-generating body that is placed on the outer surface of the cooling-wall part 51 can be cooled with good efficiency.

First Comparative Embodiment

Figure 13:
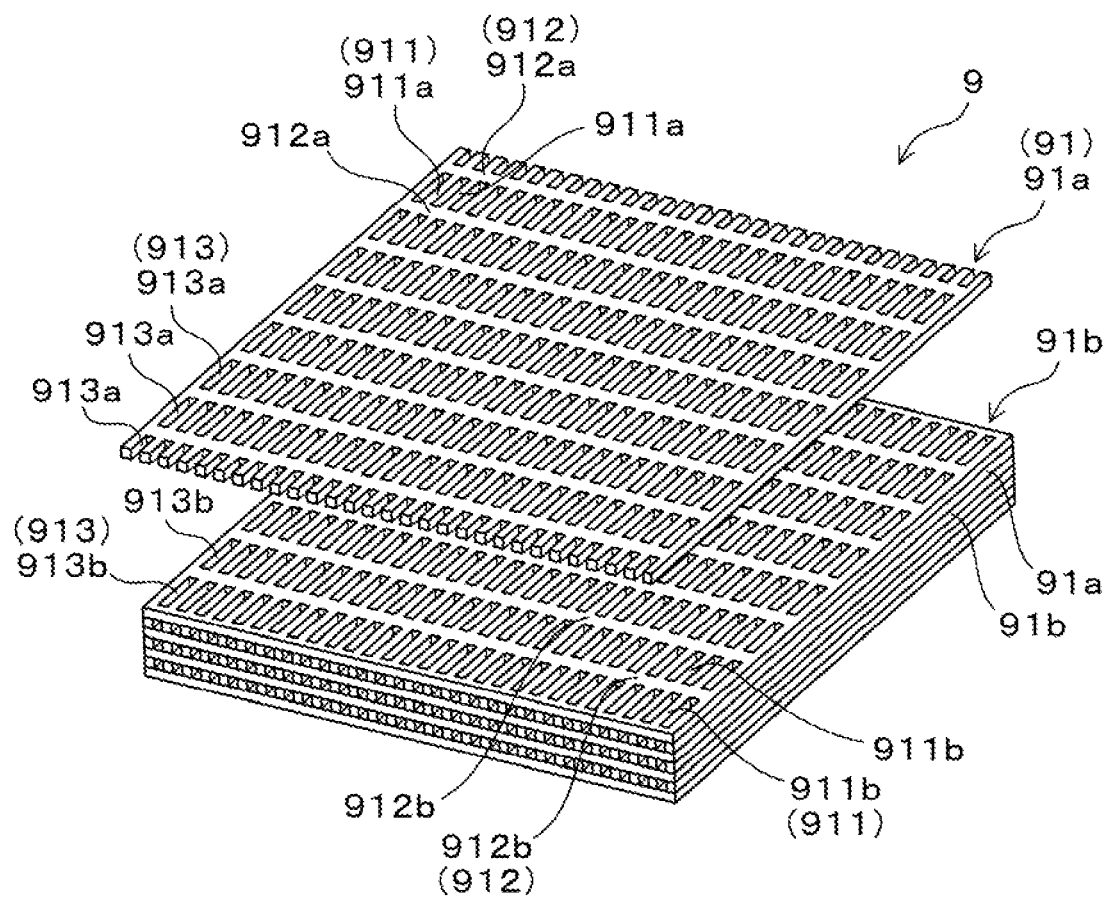
FIG. 13 is an exploded, oblique view of a heat sink, in which a plurality of plates having slits are stacked, according to a first comparative embodiment.
Figure 14:
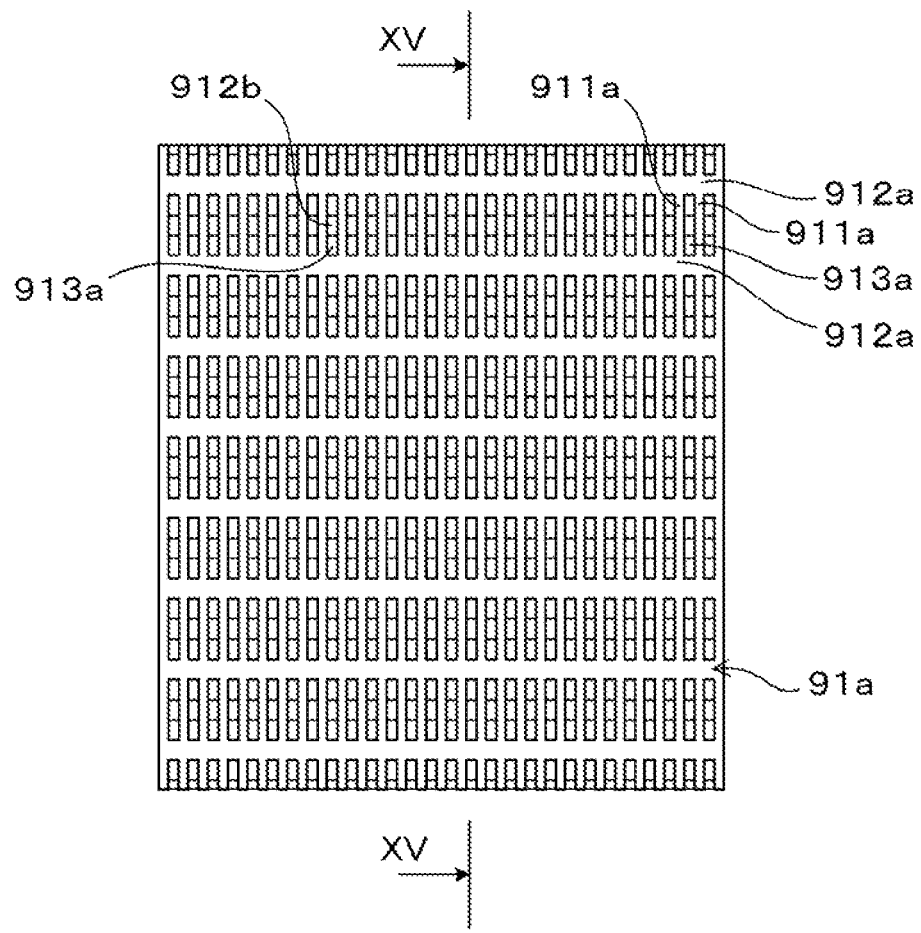
FIG. 14 is a top view of the heat sink according to the first comparative embodiment.
Figure 15:
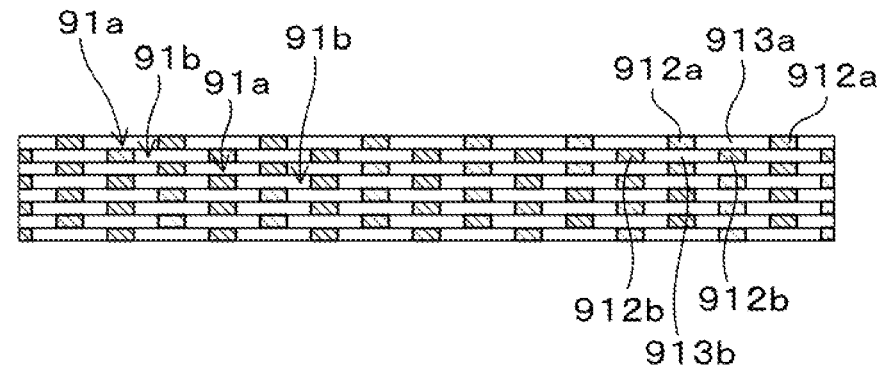
FIG. 15 is a cross-sectional view taken along line XV-XV in FIG. 14.

In the present embodiment, a heat sink 9 is explained in which a plurality of lattice-shaped plates 91 (91a, 91b), which have a plurality of longitudinal ribs 911 (911a, 911b) extending in the longitudinal direction, a plurality of transverse ribs 912 (912a, 912b) orthogonal to the longitudinal ribs 911, and a plurality of slits 913 partitioned by the longitudinal ribs 911 and the transverse ribs 912, is stacked. As shown in FIG. 13 to FIG. 15, the heat sink 9 of the present embodiment comprises the first plates 91a, which have numerous slits 913a extending in the longitudinal direction, and the second plates 91b, wherein the locations of slits 913b in the longitudinal direction are shifted relative to the slits 913a of the first plates 91a by half the pitch between the slits 913, and the first plates 91a and the second plates 91b are stacked in an alternating manner. As shown in FIG. 15, the coolant passageways of the heat sinks 9 of the present embodiment are composed of the slits 913a of the first plates 91a and the slits 913b of the second plates 91b.

Specifically, the heat sink 9 of the present embodiment has a longitudinal outer dimension of 64 mm, a transverse outer dimension of 54.2 mm, and thickness outer dimension of 8 mm. The thickness of the plates 91 is 1.0 mm. In addition, the width of the longitudinal ribs 911 of the plates 91 is 1.0 mm, and the spacing between the longitudinal ribs 911 (i.e., the width of each of the slits 913) is 0.90 mm. In addition, the width of the transverse ribs 912 of the plates 91 is 2.0 mm, and the spacing between the transverse ribs 912 (i.e., the length of each of the slits 913) is 5.75 mm.

The cooling performance and the pressure loss of the heat sink of the first embodiment and the heat sink 9 of the first comparative embodiment can be compared by, for example, the thermo-fluid simulation below.

First, a structural model was prepared in which an aluminum sheet, which served as the cooling-wall part 51, was placed on each of the heat sinks 1, 9. A heat-generating body that generated 1,650 W of heat was disposed on the cooling-wall part 51. Furthermore, a long-life coolant, which served as the coolant, was supplied at various flow rates to the coolant passageways of the heat sinks 1, 9, and, at the point in time when the temperature of the heat-generating body reached a steady state, the thermal resistance between the heat-generating body and the coolant as well as the pressure loss (i.e., the difference between the pressure of the coolant at the inlets of the coolant passageways and the pressure of the coolant at the outlets of the coolant passageways) were calculated.

Figure 16:
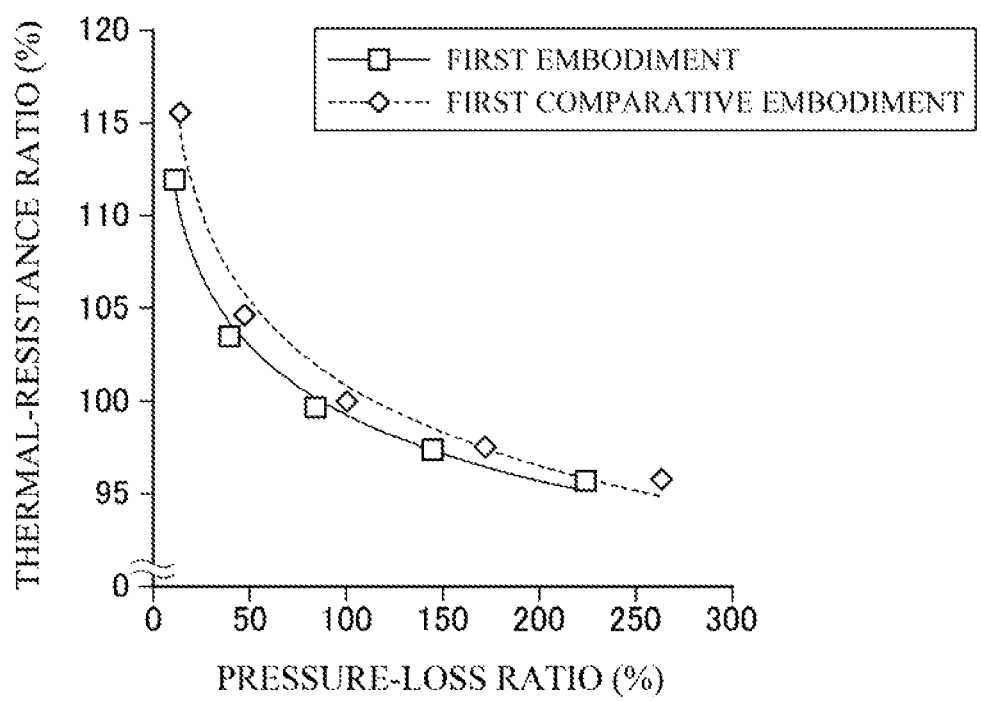
FIG. 16 is a graph in which the cooling performance of the heat sink according to the first embodiment and the cooling performance of the heat sink according to the first comparative embodiment are compared.

In FIG. 16, a graph is shown that plots the relationship between the thermal resistance and the pressure loss for the heat sink 1 of the first embodiment and the heat sink 9 of the first comparative embodiment. It is noted that the ordinate in FIG. 16 is the thermal-resistance ratio for the situation in which the thermal-resistance values when the coolant flow volume in the heat sink 9 of the first comparative embodiment was 6 L/min was used as the reference, and the abscissa is the pressure-loss ratio for the situation in which the pressure-loss values when the coolant flow volume in the heat sink 9 of the first comparative embodiment was 6 L/min was used as a reference.

As shown in FIG. 16, with regard to the heat sink 1 of the first embodiment, a thermal resistance on the same order as that of the heat sink 9 of the first comparative embodiment could be reached at a pressure loss lower than that of the heat sink 9 of the comparative embodiment. As a result, according to the heat sink 1 of the first embodiment, it could be understood that cooling performance could be increased and pressure loss could be reduced.

The specific aspects of the heat sink according to the present invention are not limited to the aspects described in the first through third embodiments, and the configurations can be modified as appropriate within a range that does not depart from the gist of the present invention. For example, the bottom parts of the first recessed parts and the second recessed parts as well as the peak parts of the first protruding parts and the second protruding parts may exhibit a shape that forms a circle, an ellipse, a quadrilateral, a hexagon, or the like, or a portion thereof.

In addition, in the first through third embodiments, configurations were described in which the bottom parts of the first recessed parts and the second recessed parts as well as the peak parts of the first protruding parts and the second protruding parts exhibit a flat-sheet shape, but the first recessed parts, the second recessed parts, the first protruding parts, and the second protruding parts may have a shape that does not have the bottom part or the peak part of a flat-sheet shape, for example, a semispherical shape.

The first fin plates 3a and the second fin plates 3b may be joined to one another by brazed joints as described in the first through third embodiments; for example, the first fin plates 3a and the second fin plates 3b may be held by coupling members that cross the plurality of fin plates and couple the plurality of fin plates.

Furthermore, in the first through third embodiments, configurations were described in which each of the fin plates has three recesses-and-protrusions rows: the upper-level, recesses-and-protrusions row, the mid-level, recesses-and-protrusions row, and the lower-level, recesses-and-protrusions row; however, each of the fin plates may have four or more recesses-and-protrusions rows. Each of the recesses-and-protrusions rows can be disposed such that, for example, it satisfies Equation (2) below. Therein, in Equation (2) below, $\lambda_h$ is the pitch between the recesses-and-protrusions rows in the transverse direction Z, h is the dimension of the heat sink in the transverse direction Z, and m is a natural number.

$$m\lambda_h/2 = h \qquad (1)$$

The invention claimed is:

1. A heat sink configured to be mountable on a cooling-wall part, which cools a heat-generating body, in a heat exchanger, the heat sink having a coolant passageway configured such that coolant is flowable therethrough, wherein:
the coolant passageway comprises:
    a coolant lead-in part, through which the coolant is introduced into the coolant passageway;
    a coolant lead-out part, from which the coolant is led out of the coolant passageway;
    a plurality of coolant-contact parts disposed spaced apart from one another along a coolant path leading from the coolant lead-in part to the coolant lead-out part, the coolant-contact parts being configured to bring the coolant into contact with the cooling-wall part;
    a first coolant-transit part disposed between adjacent ones of the coolant-contact parts and through which the coolant transits from an upstream-side one of the coolant-contact parts to a downstream-side one of the coolant-contact parts in the coolant path; and
    first connecting parts respectively interposed between the first coolant-transit part and the upstream-side one and the downstream-side of the coolant-contact parts, and
wherein the first connecting parts each have a passageway cross-sectional area that is smaller than passageway cross-sectional areas of the coolant-contact parts and the first coolant-transit part.

2. The heat sink according to claim 1, wherein the first coolant-transit part is disposed such that it is spaced farther apart from the cooling-wall part than the coolant-contact parts.

3. The heat sink according to claim 1, wherein the coolant passageway further has:
    a second coolant-transit part disposed between adjacent first coolant-transit parts and through which the coolant transits from an upstream-side one of the first coolant-transit parts to a downstream-side one of the first coolant-transit parts in the coolant path, and
    a second connecting part interposed between the second coolant-transit part and one of the first coolant-transit parts, and
    wherein the second connecting part has a passageway cross-sectional area that is smaller than passageway cross-sectional areas of the first coolant-transit parts and the second coolant-transit part.

4. The heat sink according to claim 1, comprising a plurality of fin plates stacked on one another, wherein the coolant passageway is formed between adjacent ones of the fin plates.

5. The heat sink according to claim 4, wherein:
the plurality of fin plates comprises first fin plates and second fin plates stacked in an alternating manner;
the first fin plates each comprise:
    first reference-surface parts;
    first recessed parts recessed in a first direction of a stacking direction relative to the first reference-surface parts; and
    first protruding parts, which protrude from the first reference-surface parts in a second direction, which is a direction opposite of the first direction; and
the first recessed parts and the first protruding parts are disposed in an alternating manner in a transverse direction and a longitudinal direction of the first fin plate;
the second fin plates each comprise:
    second reference-surface parts;
    second recessed parts recessed in the first direction relative to the second reference-surface parts; and
    second protruding parts, which protrude from the second reference-surface parts in the second direction;
the second recessed parts and the second protruding parts are disposed in an alternating manner in the transverse direction and the longitudinal direction;
the first recessed parts respectively face the second protruding parts; and
the second recessed parts respectively face the first protruding parts.

6. The heat sink according to claim 5, wherein the first reference-surface parts are disposed at portions surrounded by the first protruding parts and the first recessed parts, and the second reference-surface parts are disposed at portions surrounded by the second protruding parts and the second recessed parts.

7. A heat exchanger, comprising:
    a cooling jacket that has: an outer-wall part, which includes the cooling-wall part that cools the heat-generating body; an interior space, which is surrounded by the outer-wall part; a coolant inlet, which passes through the outer-wall part and supplies the coolant from an exterior of the heat exchanger to the interior space; and a coolant outlet, which discharges the coolant from the interior space to the exterior of the heat exchanger; and
    the heat sink according to claim 1 housed in the interior space of the cooling jacket.

8. The heat sink according to claim 6, wherein the coolant-transit part is disposed such that it is spaced farther apart from the cooling-wall part than the coolant-contact parts.

9. The heat sink according to claim 8, wherein the coolant passageway has:
    another first coolant-transit part,
    a second coolant-transit part disposed between adjacent ones of the first coolant-transit parts and through which the coolant transits from an upstream-side one of the first coolant-transit parts to a downstream-side one of the first coolant-transit parts in the coolant path, and
    a second connecting part interposed between the second coolant-transit part and one of the first coolant-transit parts, and
    wherein the second connecting part has a passageway cross-sectional area that is smaller than passageway cross-sectional areas of the first coolant-transit parts and the second coolant-transit part.

10. The heat sink according to claim 9, wherein:
facing ones of the first protruding parts and the second recessed parts are respectively joined via brazed joints, and facing ones of the first recessed parts and the second protruding parts are respectively joined via brazed joints.

11. A heat exchanger comprising:
a cooling jacket that has: an outer-wall part, which includes the cooling-wall part that cools the heat-generating body; an interior space, which is surrounded by the outer-wall part; a coolant inlet, which passes through the outer-wall part and supplies the coolant from an exterior of the heat exchanger to the interior space; and a coolant outlet, which discharges the coolant from the interior space to the exterior of the heat exchanger; and
the heat sink according to claim 10 housed in the interior space of the cooling jacket.

12. The heat exchanger according to claim 11, wherein the heat sink is joined to the cooling wall part via one or more brazed joints.

13. A heat sink configured to be mountable on a cooling wall of a heat exchanger, the heat sink having coolant passageway configured such that coolant is flowable therethrough and comprising:
a coolant lead-in part configured to introduce the coolant into the coolant passageway;
a coolant lead-out part configured to discharge the coolant from the coolant passageway;
an upstream coolant-contact part in fluid communication with the coolant lead-in part;
a downstream coolant-contact part disposed spaced apart from the upstream coolant-contact part in a coolant path extending from the coolant lead-in part to the coolant lead-out part;
a first coolant-transit part disposed between the upstream coolant-contact part and the downstream coolant-contact part in the coolant path; and
first connecting parts respectively interposed between, and fluidly connecting, the first coolant-transit part and the upstream coolant-contact part and the downstream coolant-contact part;
wherein:
the upstream and downstream coolant-contact parts are configured to cause the coolant flow against the cooling-wall part, and
the first connecting parts each have a passageway cross-sectional area that is smaller than passageway cross-sectional areas of the upstream and downstream coolant-contact parts and of the first coolant-transit part.

14. The heat sink according to claim 13, wherein the first coolant-transit part is disposed spaced farther apart from the cooling-wall part than the upstream and downstream coolant-contact parts.

15. The heat sink according to claim 14, wherein the coolant passageway has:
another first coolant-transit part,
a second coolant-transit part disposed between an upstream one of the first coolant-transit parts and downstream one of the coolant-transit parts in the coolant path, and
second connecting parts respectively interposed between, and fluidly connecting, the second coolant-transit part with the upstream one of the first coolant-transit parts and the downstream one of the coolant-transit parts,
wherein the second connecting parts have a passageway cross-sectional area that is smaller than passageway cross-sectional areas of the first coolant-transit parts and the second coolant-transit part.

16. The heat sink according to claim 1, comprising first and second fin plates joined together by brazed joints, wherein the coolant passageway is defined by the first and second fin plates.

17. A heat exchanger comprising:
a cooling jacket that has: an outer-wall part, which includes the cooling-wall part that cools the heat-generating body; an interior space, which is surrounded by the outer-wall part; a coolant inlet, which passes through the outer-wall part and supplies the coolant from an exterior of the heat exchanger to the interior space; and a coolant outlet, which discharges the coolant from the interior space to the exterior of the heat exchanger; and
the heat sink according to claim 16 housed in the interior space of the cooling jacket.

18. The heat exchanger according to claim 17, wherein the heat sink is joined to the cooling wall part via one or more brazed joints.

* * * * *